(12) United States Patent
Bakker (10) Patent No.: US 7,701,554 B2
(45) Date of Patent: Apr. 20, 2010

(54) LITHOGRAPHIC APPARATUS, DEVICE MANUFACTURING METHOD, AND OPTICAL COMPONENT

(75) Inventor: Levinus Pieter Bakker, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 1352 days.

(21) Appl. No.: 11/024,013

(22) Filed: Dec. 29, 2004

(65) Prior Publication Data

US 2006/0141367 A1    Jun. 29, 2006

(51) Int. Cl.
G03B 27/34    (2006.01)
G03B 27/42    (2006.01)

(52) U.S. Cl. .................................. 355/57; 355/53

(58) Field of Classification Search ............. 355/57, 355/53, 67, 30; 118/715; 427/9, 248.1; 359/359
See application file for complete search history.

(56) References Cited

U.S. PATENT DOCUMENTS

| 2003/0147058 A1* | 8/2003 | Murakami et al. ............ 355/53 |
| 2006/0066940 A1* | 3/2006 | Trenkler et al. ............. 359/359 |
| 2006/0072084 A1* | 4/2006 | Van Herpen et al. .......... 355/30 |

FOREIGN PATENT DOCUMENTS

| EP | 1 065 568 A2 | 1/2001 |
| EP | 1 186 957 A2 | 3/2002 |
| EP | 1 065 568 A3 | 3/2003 |
| EP | 1 369 744 A1 | 12/2003 |
| EP | 1 416 329 A1 | 5/2004 |
| JP | 2001-051106 A | 2/2001 |
| JP | 2001-059901 A | 3/2001 |
| JP | 2002-110539 A | 4/2002 |
| JP | 2002-134386 A | 5/2002 |
| JP | 2004-134743 A | 4/2004 |
| JP | 2004-153279 A | 5/2004 |
| JP | 2005-268359 A | 9/2005 |
| WO | WO 2004079753 A2 * | 9/2004 |

OTHER PUBLICATIONS

English Translation of Internation Preliminary Report On Patentability fo PCT/EP04/02014 issued on Feb. 13, 2006.*
English Translation of Japanese Official Action issued on Dec. 10, 2008 in related Japanese Application No. 2005-377250.

* cited by examiner

Primary Examiner—Peter B Kim
(74) Attorney, Agent, or Firm—Pillsbury Winthrop Shaw Pittman, LLP

(57) ABSTRACT

An optical component for use in a lithographic apparatus. The optical component includes an optical element having an optical surface for reflecting electromagnetic radiation, and a protective zone covering the optical surface. The protective zone is provided with a material that substantially protects the optical surface against sputtering when the optical component is in use. The material has a refractive index that approximately equals unity for at least a predetermined wavelength of electromagnetic radiation to which the optical surface is exposed.

27 Claims, 4 Drawing Sheets

LITHOGRAPHIC APPARATUS, DEVICE MANUFACTURING METHOD, AND OPTICAL COMPONENT

FIELD

The present invention relates to a lithographic apparatus and a method for manufacturing a device. The present invention more specifically relates to an optical component for use in the lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

The imaging of the pattern may be performed with a projection system that often includes a plurality of optical elements, such as mirrors and/or lenses. The term "projection system" should therefore be interpreted broadly as encompassing various types of projection systems, including refractive optics, reflective optics, and catadioptric systems, for example.

In a lithographic apparatus, the size of features that can be imaged onto the substrate is limited by the wavelength of the projection radiation. To produce integrated circuits with a higher density of devices, and hence higher operating speeds, it is desirable to image smaller features. While most current lithographic projection apparatus employ ultraviolet light generated by mercury lamps or excimer lasers, it has been proposed to use shorter wavelength radiation, in the range of 5 to 20 nm, in particular around 13 nm.

Such radiation is termed extreme ultra violet (EUV) or soft X-ray and possible sources include, for example, laser produced plasma sources, discharge plasma sources, or synchrotron radiation from electron storage rings. These types of radiation require that the beam path in the apparatus be evacuated to avoid beam scatter and absorption. Because there is no known material suitable for making a refractive optical element for EUV radiation, EUV lithographic apparatus use mirrors in the radiation (illumination) and projection systems. Even multilayer mirrors for EUV radiation have relatively low reflectivities and are highly susceptible to contamination, which further reduces their reflectivity and, hence, the throughput of the apparatus. This may impose further specifications on the vacuum level to be maintained, and may necessitate especially that hydrocarbon partial pressures be kept very low.

Plasma sources produce, as a by-product of the generation of radiation, debris particles that include ions, atoms, molecules, and tin droplets. The ions often have a high speed. Also the atoms, molecules and tin droplets may be ionized due to, for example, photo-ionization. These particles also may have a high speed.

A problem associated with optical elements exposed to the fast particles is oxidation of the top layer of these optical elements. In an attempt to solve this problem, European Patent Application Publication No. EP-A-1 369 744 discloses a capping layer that includes an alloy of Mo and Cr for protection against a chemical attack.

European Patent Application Publication No. EP-A-1 065 568 discloses a capping layer formed of a relatively inert material, for example, diamond-like carbon, boron nitride, or another material resistant to oxidation.

European Patent Application Publication No. EP-A-1 416 329 discloses a capping layer that includes one or more fullerenes. The fullerenes may be provided on an outer layer of a mirror. Being chemically inert, the fullerenes substantially lower the probability of incoming particles sticking to the mirror.

Another problem encountered in multi-layered mirrors is the intermixing of the multi-layers. According to EP-A-1 416 329, fullerenes may be provided between layers of a multi-layered mirror, thereby preventing the layers from intermixing. EP-A-1 416 329 also mentions the use of ruthenium-molybdenum layers as a protective capping layer.

Yet another problem encountered is the sputtering of the outer layer of optical elements due to the impact of the fast particles. This is a damaging effect to the optical elements of the projection system. The mirror surface roughens due to the sputtering, thereby leading to loss of reflection and imaging deterioration. Furthermore, as the removal of material from the mirror surface is a net translation of that carefully positioned surface, the apparatus, and in particular the illumination and/or projection system, may not perform as intended.

European Patent Application Publication No. EP-A-1 186 957 discloses a lithographic projection apparatus having gas supply means for supplying a gaseous hydrocarbon to a space containing a mirror. This hydrocarbon physically or chemically adsorbs to a surface of the mirror and thus forms a protective layer on the surface. When the fast particles produced by the plasma source hit the surface of the mirror, hydrocarbon molecules are dislodged from the protective layer. When this protective layer is too thick, reflectivity of the mirror becomes unacceptably low. Therefore, the thickness of this protective layer should be controlled to avoid a decrease in reflectivity of the mirror, and to maintain the protectiveness of the layer against incoming particles.

SUMMARY

It is desirable to provide an optical element that can sustain an environment in which fast particles approach the element, while performing its optical function, thereby resulting in a relatively long lifetime of the optical component.

According to an aspect of the invention, there is provided an optical component for use in a lithographic apparatus. The optical component includes an optical element having an optical surface for reflecting electromagnetic radiation, and a protective zone covering the optical surface. The protective zone is provided with a material that substantially protects the optical surface against sputtering when the optical component is in use. The material has a refractive index that approximately equals unity for at least a predetermined wavelength of electromagnetic radiation to which the optical surface is exposed.

According to an aspect of the invention, there is provided a lithographic apparatus. The lithographic apparatus includes an illumination system configured to condition a radiation beam, and a support constructed to support a patterning device. The patterning device is capable of imparting the radiation beam with a pattern in its cross-section to form a patterned radiation beam. The lithographic apparatus also includes a substrate table constructed to hold a substrate, a projection system configured to project the patterned radiation beam onto a target portion of the substrate, and an optical component in the illumination system or the projection system. The optical component includes an optical element having an optical surface for reflecting electromagnetic radiation, and a protective zone covering the optical surface. The protective zone is provided with a material dimensioned so that in use, the optical surface is substantially protected against sputtering. The material has a refractive index that approximately equals unity for at least a predetermined wavelength of electromagnetic radiation to which the optical surface is exposed.

According to an aspect of the invention, a device manufacturing method is provided. The method includes conditioning a radiation beam with an illumination system; patterning the radiation beam with a patterning device; and projecting the patterned radiation beam onto a substrate. The illumination system includes an optical component that is used in conditioning the radiation beam. The optical component includes an optical element having an optical surface for reflecting electromagnetic radiation, and a protective zone covering the optical surface. The protective zone is provided with a material that substantially protects the optical surface against sputtering during said conditioning. The material has a refractive index that approximately equals unity for at least a predetermined wavelength of electromagnetic radiation to which the optical surface during said conditioning.

As the optical surface is covered by a zone having a material that is transparent for the electromagnetic radiation, the radiation may still reach the optical surface and the optical surface may still perform its function. As the material is dimensioned so that the optical surface is substantially protected against sputtering, the material of the protective zone will be sputtered away, i.e. be sacrificed, instead of the optical surface. Hence, the optical component will be able to perform its function in a sputtering environment, which is beneficial to the lifetime of the optical surface.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4b schematically depicts a cross-sectional view of the optical component shown in FIG. 4a.

DETAILED DESCRIPTION

Figure 1:
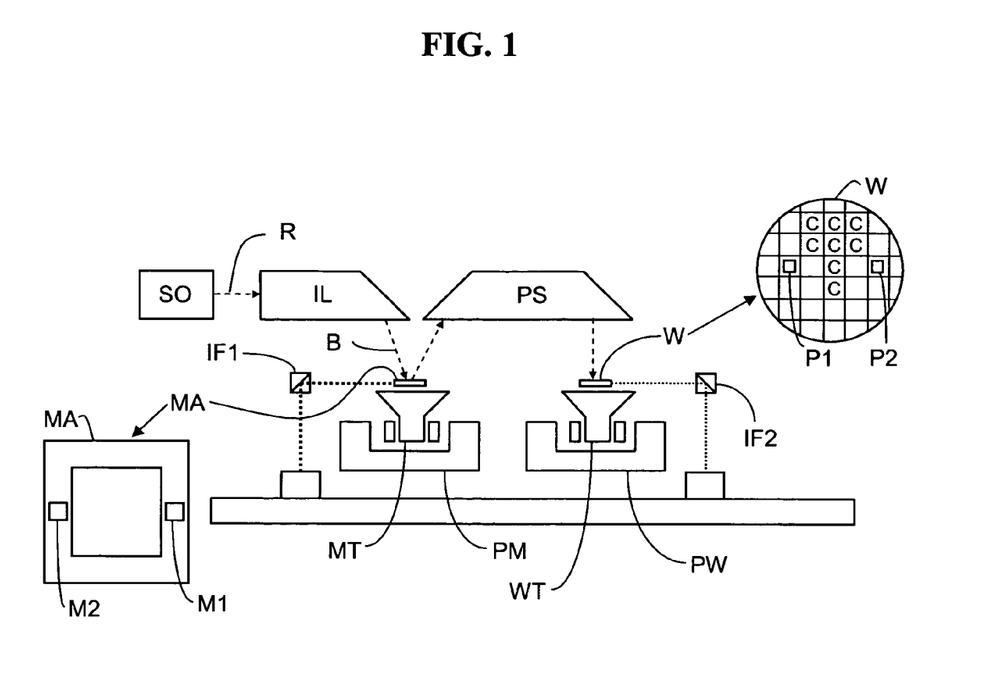
FIG. 1 depicts a lithographic apparatus according to an embodiment of the invention.

FIG. 1 schematically depicts a lithographic apparatus according to an embodiment of the invention. The apparatus includes an illumination system (illuminator) IL configured to condition a radiation beam B (e.g. ultra violet radiation, or extreme ultra violet radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation. FIGS. 2, 3, 4a, and 4b show more detailed examples of optical components. Such an optical component has an optical surface, i.e. a surface which changes a direction of incident radiation.

The support structure MT supports, i.e. bears the weight of, the patterning device MA. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable, as required. The support structure may ensure that the patterning device is at a desired position, for example, with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam R from a radiation source SO. The source and the lithographic apparatus may be separate entities, for example when the source is an excimer laser. In such cases, the source is not considered to form part of the lithographic apparatus and the radiation beam R is passed from the source SO to the illuminator IL with the aid of a beam delivery system including, for example, suitable directing mirrors and/or a beam expander. In other cases, the source may be an integral part of the lithographic apparatus, for example, when the source is a mercury lamp. The source SO and the illuminator IL, together with the beam delivery system, if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned, while a pattern imparted to the radiation beam is projected onto a target portion C. In this mode, generally, a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
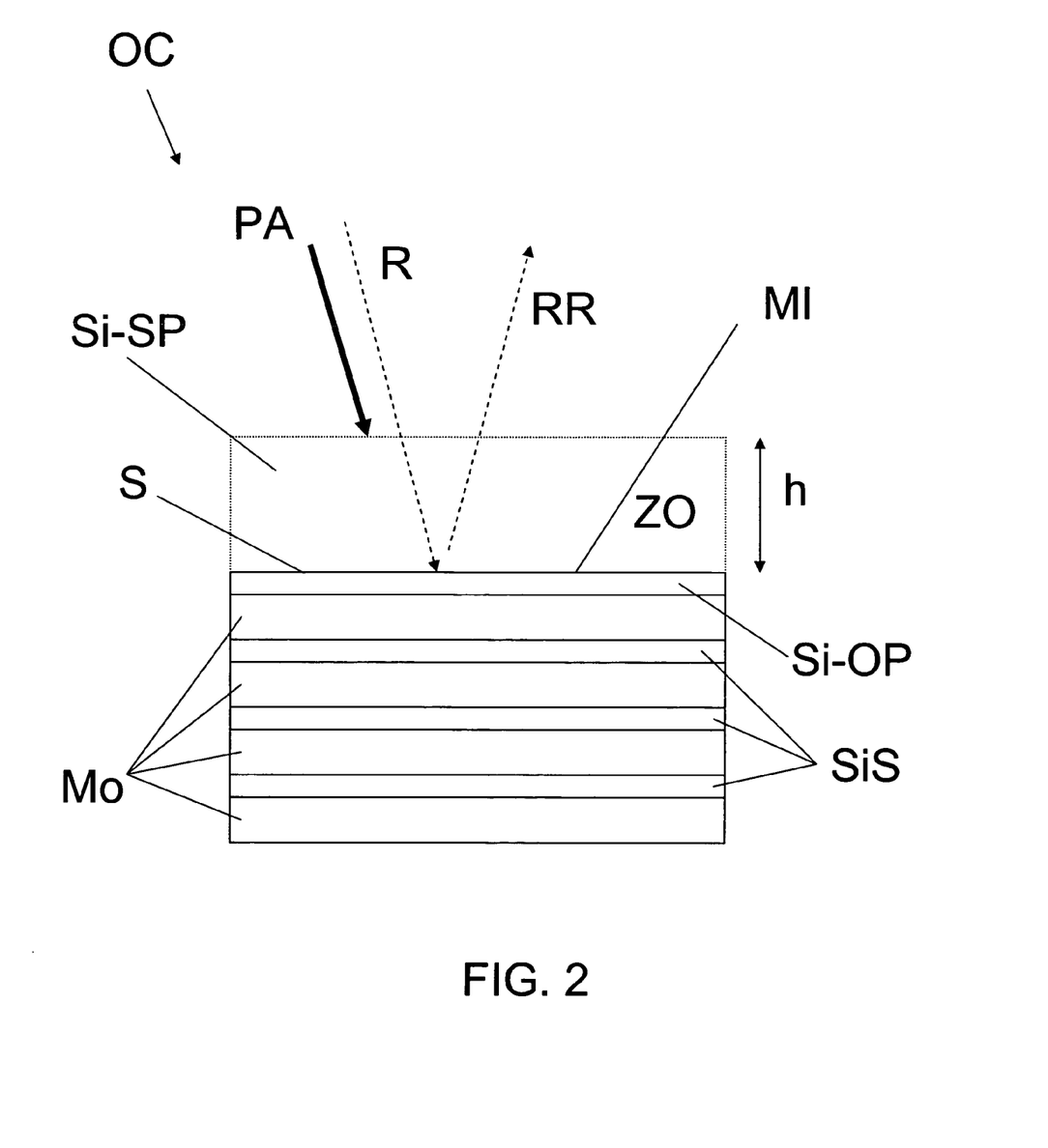
FIG. 2 schematically depicts a cross-sectional view of an embodiment of an optical component of the lithographic apparatus of FIG. 1.

FIG. 2 schematically depicts a cross-sectional view of an embodiment of an optical component OC, or at least a part thereof, according to the invention. The optical component OC may be used in the illumination system IL of the lithographic apparatus of FIG. 1. In addition, or alternatively, the optical component OC may be used in the projection system PS of the lithographic apparatus of FIG. 1. The optical component OC includes an optical element, in this case a mirror MI, which includes layers of silicon Si and molybdenum Mo having, for example, a thickness of 4.4 and 2.5 nanometer, respectively. The mirror MI further includes an optical surface S for reflecting electromagnetic radiation, in particular, radiation in the EUV range. The optical component OC also includes a protective zone ZO covering the optical surface S. The protective zone ZO is provided with a material that is selected and dimensioned so that, in use, the optical surface S is substantially protected against sputtering. The protective zone ZO shown is indicated by dotted lines. The material preferably has a refractive index that approximately equals unity for at least a predetermined wavelength of electromagnetic radiation, in this example EUV, to which the optical surface S is exposed in use. The material may be dimensioned so that the material forms a layer extending parallel to the optical surface S. The zone ZO as depicted by the dotted line in FIG. 2 may thus completely consist of the protective material. The material may include silicon, for example.

It is possible, as shown, that the mirror MI also includes silicon. Silicon layers SiS separating the molybdenum layers Mo, function as spacers between the molybdenum layers Mo. The silicon layer Si—OP is a silicon layer that is intended to protect the molybdenum layer closest to the surface S against oxidation. The layer of silicon Si—SP, in this example coinciding with the zone ZO, has a thickness h that is larger than a thickness of a layer of the material (Si—OP) necessary to protect the optical surface S against oxidation. It should be appreciated that the layer Si—OP and layer Si—SP may together form one integral layer.

The silicon layer Si—SP and/or Si—OP may be crystalline or amorphous, to an extent that the refractive index equals approximately unity for the radiation to which the optical surface S—in use—is exposed. The thickness of the layer Si—SP is chosen by a person skilled in the art on the basis of a specified lifetime of the optical surface S and an acceptable loss of intensity in radiation due to absorption of radiation in that layer, bearing in mind the likely sputter rate of the optical surface S during conditions of use.

In use, the optical component OC works as follows. Radiation R approaches the optical surface S and is reflected to result in reflected radiation RR. Particles PA, capable of sputtering the optical surface S, will sputter the layer Si—SP, i.e. the material provided in the protective zone ZO, instead of the optical surface S. In other words, the material provided in the protective zone ZO is sacrificed for the sake of the optical surface S.

It should be appreciated that the embodiment shown in FIG. 2 may be especially useful when the radiation and/or the particles approach the optical surface S from a direction normal, or approximately normal, to that surface S.

Figure 3:
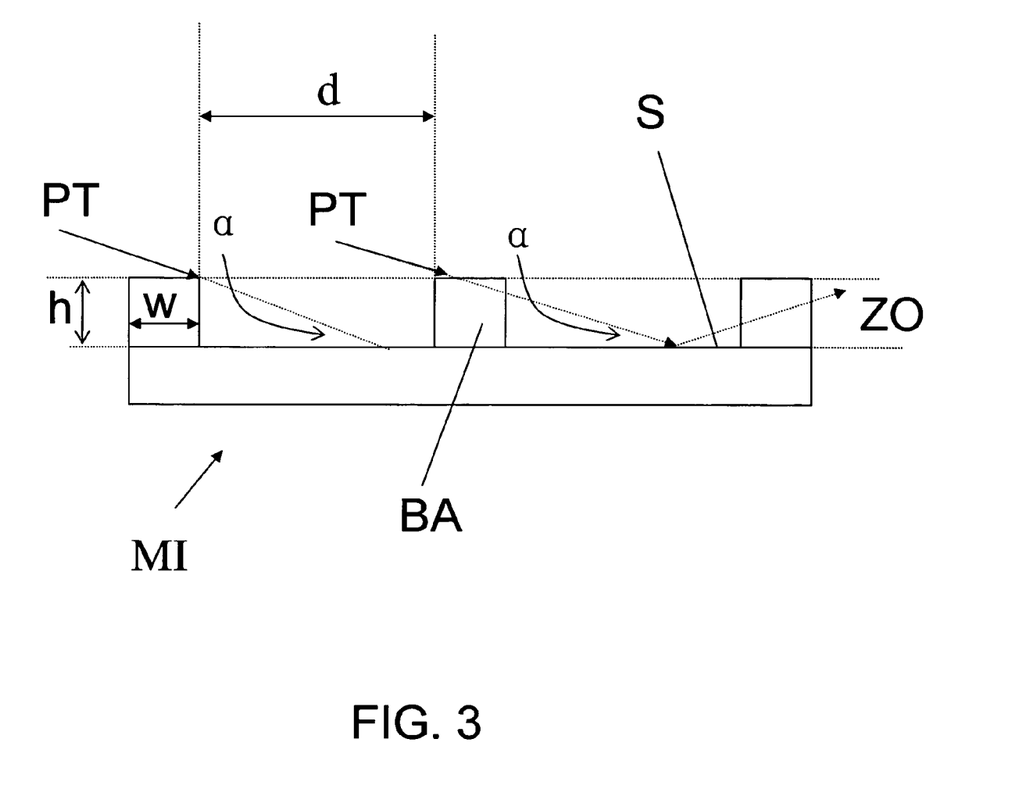
FIG. 3 schematically depicts a cross-sectional view of an embodiment of an optical component of the lithographic apparatus of FIG. 1.

FIG. 3 shows a side view of an embodiment of the optical component according to the invention, which can be used in the lithographic apparatus depicted in FIG. 1. The optical component includes an optical element, in this case mirror MI. In this example, the mirror MI includes a low roughness ruthenium layer on a substrate and further includes an optical surface S for reflecting electromagnetic radiation, in particular in the EUV range. The optical component includes a zone ZO for protecting the optical surface S. This zone ZO covers the optical surface. The zone ZO includes a number of parts, in this embodiment bars BA, which are spaced apart in a direction along the optical surface S. The parts BA include a solid material. The parts, in this case the bars BA, include silicon, which is an example of a material that is transparent for electromagnetic radiation with a predetermined wavelength in the extreme ultraviolet range, for example, a wavelength of 13.5 nm in vacuum, and has a refractive index approximately equaling unity. The parts, and thus the bars BA, are spaced apart in a direction along the optical surface, and dimensioned so that the optical surface S is substantially protected by the parts against particles PT that approach the surface in a predetermined direction. This predetermined direction is the direction in which fast particles PT travel along the EUV radiation that is intended to be reflected by the optical surface. In this embodiment, the bars BA are substantially parallel. This is a simple configuration that may be easily applied and that is capable of ensuring that the entire optical surface is protected. Furthermore, the bars BA are attached to the surface S, which may have the advantage that the bars BA do not need separate support.

The optical component OC works as follows. Fast particles PT, such as fast ions, may approach the surface S. The direction of the movement of the particles PT is the same, or about the same, as the direction in which the electromagnetic radiation propagates before interacting with the optical surface S. This direction defines a predetermined angle $\alpha$ with the optical surface S. This predetermined angle $\alpha$ is an angle at which the radiation approaches the optical surface S in order to be reflected by that surface as intended. Particles approaching the surface from a direction that coincides with the predetermined direction, at which this radiation approaches the surface, are blocked by the solid parts BA. As can be seen in FIG. 3, an incoming particle moving in a direction that defines the angle $\alpha$ with surface S will hit at least one of the bars BA before reaching the surface S. Parameters that can be determined in advance to achieve this effect are, for example, the height h of the bars BA, the width w of the bars, and the above-mentioned distance d between the bars BA. The width w of the bars may, for example, be 100 nm. Of course, other shapes of bars may also be used, such as trapezoid bars, cylindrical bars or parallelepiped bars of which the dimensions and orientation may also easily be determined by a person skilled in the art. In this example, the bars BA have a longitudinal direction perpendicular to the direction in which—in use—the particles PT approach the optical surface S. This may be advantageous, as in this fashion, the bars may be positioned relatively far away from each other.

As the number of solid parts is spaced apart and the solid material is transparent to the electromagnetic radiation, the optical surface may still be reached by the radiation that approaches the optical surface in the predetermined direction. Consequently, those parts of the optical surface that may be reached by the radiation and that are protected from the incoming particles should not be sputtered away. If these parts of the optical surface were to be sputtered away, and as a result of this be roughened, a loss of reflection and in imaging deterioration may result. Furthermore, removal of material from the optical surface may result in a net translation of the accurately positioned surface. In other words, the optical surface of an optical component according to the invention does not easily get sputtered away and does not easily get roughened, thereby enhancing its lifetime.

Figure 4A:
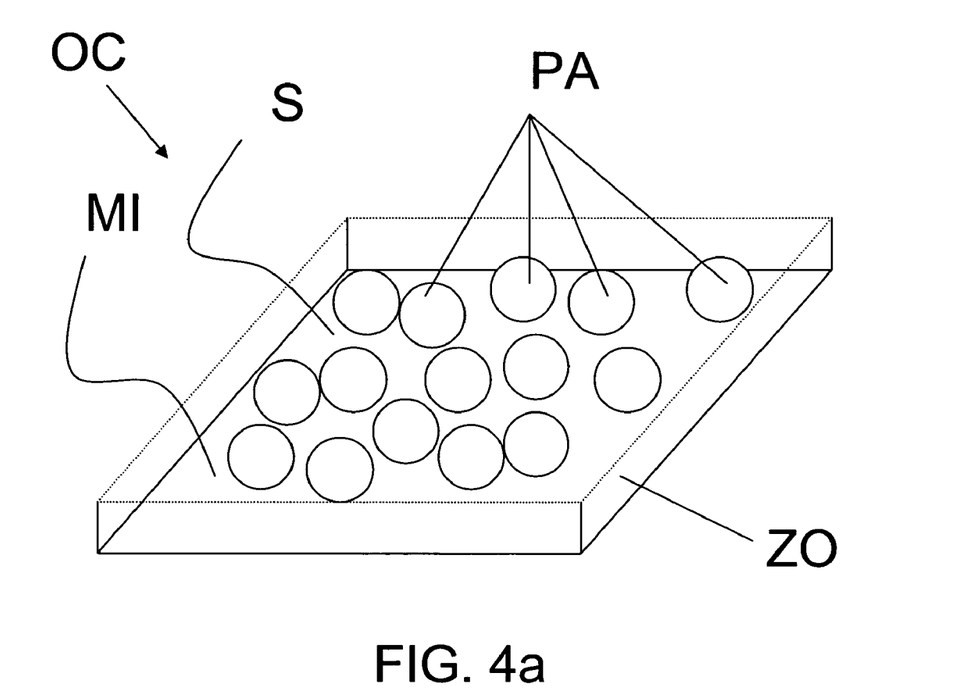
FIG. 4a schematically depicts a perspective view of an embodiment of an optical component of the lithographic apparatus of FIG. 1.

Another embodiment is shown in FIG. 4a. FIG. 4a shows a perspective view of another embodiment of the optical component OC according to the present invention. The optical component OC includes a mirror MI having an optical surface S. The optical component OC further includes a zone ZO for protecting the optical surface S. The zone ZO includes a number of parts PA that are spaced apart in a direction along the optical surface S. In this embodiment, the parts PA have in all directions dimensions within the same order of magnitude. This means that the parts PA may be parallelepipeds, cubes, spheres, or tetrahedrons, or may have an undefined shape. The pattern in which the parts PA are distributed over the surface S may be predetermined. As shown in FIG. 4a, however, it is possible to more or less evenly distribute the parts PA along the surface without a predetermined pattern. In that case, the average distance between the parts PA and the standard deviation thereof may be predetermined parameters. The application of this protective zone ZO may be relatively easy, relatively of low-cost, and may be carried out by techniques well known to the skilled person.

Figure 4B:
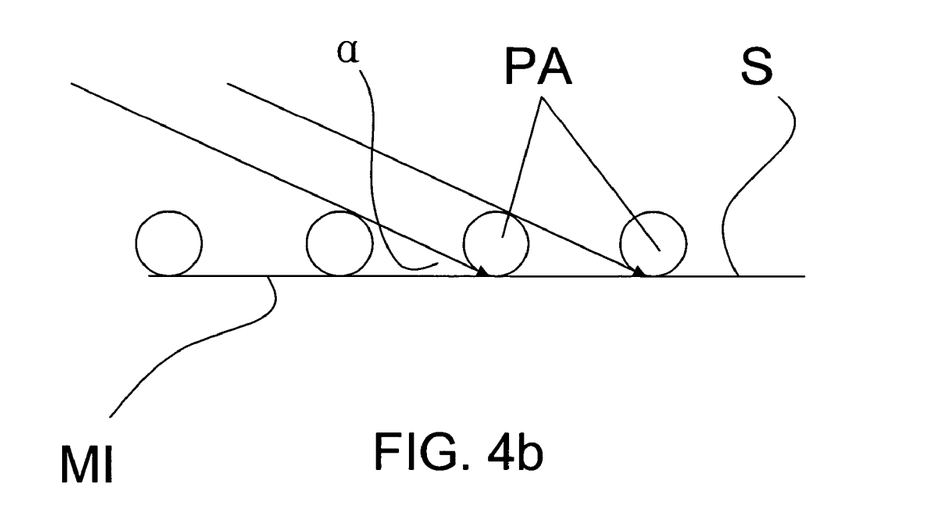

A typical value for a characteristic diameter of the parts is, for example, 100 nm. Turning to FIG. 4b, it is shown that the optical surface is substantially protected by the parts against incoming particles under the predetermined angle α.

The optical component OC according to the invention is not limited to the embodiments described above. The protective zone ZO is not necessarily attached to the optical surface, and may be located at a distance. This distance may be constant along a direction running along the optical surface S. Also, both of the embodiments described herein may be used as a spectral purity filter. The optical element described herein includes a mirror, but may include a lens instead.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" as used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm).

It will be obvious to those skilled in the art that the "index of refraction" may be written as a complex number.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An optical component for use in a lithographic apparatus, the optical component comprising:
   an optical element having an optical surface for reflecting electromagnetic radiation; and
   a protective zone covering the optical surface, the protective zone being provided with a layer of material that extends parallel to the optical surface and substantially protects the optical surface against sputtering when the optical component is in use,
   wherein the material has a refractive index that approximately equals unity for at least a predetermined wavelength of electromagnetic radiation to which the optical surface is exposed, wherein the layer has a thickness that is larger than a thickness needed to protect the optical surface against oxidation, and wherein the material is distributed over a number of parts that are spaced apart in a direction along the optical surface and are dimensioned so that the optical surface is substantially protected by the parts against particles that approach the optical surface in a direction that defines a predetermined angle with the optical surface.

2. An optical component according to claim 1, wherein the material is attached to the optical surface.

3. An optical component according to claim 1, wherein the parts have the shape of bars that extend along the optical surface.

4. An optical component according to claim 3, wherein the bars are substantially parallel.

5. An optical component according to claim 3, wherein a longitudinal direction of the bars is perpendicular to a direction from which the particles approach the optical surface.

6. An optical component according to claim 5, wherein a distance between the bars is predetermined.

7. An optical component according to claim 5, wherein a cross-section of at least one of the bars is predetermined.

8. An optical component according to claim 1, wherein the predetermined wavelength is in the ultra violet range.

9. An optical component according to claim 8, wherein the predetermined wavelength is in the extreme ultra violet range.

10. An optical component according to claim 1, wherein the material comprises silicon.

11. An optical component according to claim 1, wherein a substantial number of the parts have in all directions dimensions of about the same order of magnitude.

12. An optical component according to claim 11, wherein the parts are substantially evenly distributed along the optical surface.

13. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate; and
   an optical component in the illumination system or the projection system comprising
      an optical element having an optical surface for reflecting electromagnetic radiation; and
      a protective zone covering the optical surface, the protective zone being provided with a layer of material extending parallel to the optical surface and dimensioned so that in use, the optical surface is substantially protected against sputtering,
   wherein the material has a refractive index that approximately equals unity for at least a predetermined wavelength of electromagnetic radiation to which the optical surface is exposed, wherein the layer has a thickness that is larger than needed to protect the optical surface against oxidation, and wherein the material is distributed over a number of parts that are spaced apart in a direction alone the optical surface and are dimensioned so that the optical surface is substantially protected by the parts against particles that approach the optical surface in a direction that defines a predetermined angle with the optical surface.

14. A lithographic apparatus according to claim 13, wherein the material is attached to the optical surface.

15. A lithographic apparatus according to claim 13, wherein the parts have a shape of bars that extend along the optical surface.

16. A lithographic apparatus according to claim 15 wherein the bars are substantially parallel to each other.

17. A lithographic apparatus according to claim 15, wherein a longitudinal direction of the bars is perpendicular to a direction from which the particles approach the optical surface.

18. A lithographic apparatus according to claim 17, wherein a distance between the bars is predetermined.

19. A lithographic apparatus according to claim 17, wherein a cross-section of at least one of the bars is predetermined.

20. A lithographic apparatus according to claim 13, wherein the predetermined wavelength is in the ultra violet range.

21. A lithographic apparatus according to claim 20, wherein the predetermined wavelength is in the extreme ultra violet range.

22. A lithographic apparatus according to claim 13, wherein the material comprises silicon.

23. A lithographic apparatus according to claim 13, wherein a substantial number of the parts have in all directions dimensions within the same order of magnitude.

24. A lithographic apparatus according to claim 23, wherein the parts are substantially evenly distributed along the optical surface.

25. A lithographic apparatus according to claim 13, wherein the optical component is in the illumination system.

26. A lithographic apparatus according to claim 13, wherein the optical component is in the projection system.

27. A device manufacturing method comprising:
conditioning a radiation beam with an illumination system;
patterning the radiation beam with a patterning device; and
projecting the patterned radiation beam onto a substrate,
wherein the illumination system comprises an optical component that is used in said conditioning the radiation beam, the optical component comprising
an optical element having an optical surface for reflecting electromagnetic radiation; and
a protective zone covering the optical surface, the protective zone being provided with a layer of material that extends parallel to the optical surface and substantially protects the optical surface against sputtering during said conditioning,
wherein the material has a refractive index that approximately equals unity for at least a predetermined wavelength of electromagnetic radiation to which the optical surface is exposed during said conditioning, wherein the layer has a thickness that is larger than needed to protect the optical surface against oxidation, and wherein the material is distributed over a number of parts that are spaced apart in a direction along the optical surface and are dimensioned so that the optical surface is substantially protected by the parts against particles that approach the optical surface in a direction that defines a predetermined angle with the optical surface.

* * * * *